(12) United States Patent
Egami et al.

(10) Patent No.: US 9,194,038 B2
(45) Date of Patent: Nov. 24, 2015

(54) THIN FILM FORMING APPARATUS, THIN FILM FORMING METHOD, AND SHIELD COMPONENT

(75) Inventors: Akihiro Egami, Kawasaki (JP); Toshikazu Nakazawa, Saitama (JP); Katsuhiro Suzuki, Fuchu (JP); Shinya Hasegawa, Fuchu (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 586 days.

(21) Appl. No.: 12/974,245

(22) Filed: Dec. 21, 2010

(65) Prior Publication Data

US 2011/0155059 A1 Jun. 30, 2011

(30) Foreign Application Priority Data

Dec. 28, 2009 (JP) ................................. 2009-296786
Dec. 9, 2010 (JP) ................................. 2010-274888

(51) Int. Cl.
*C23C 14/00* (2006.01)
*C23C 14/34* (2006.01)
(Continued)

(52) U.S. Cl.
CPC ............... *C23C 14/564* (2013.01); *C23C 14/34* (2013.01); *C23C 16/4401* (2013.01);
(Continued)

(58) Field of Classification Search
CPC .. C23C 14/34; C23C 14/564; C23C 16/4401; C23C 16/4404; C23C 16/4585; C23C 14/0036; C23C 14/0068; C23C 14/021; C23C 14/3407; C23C 16/0227; C23C 16/45587–16/45591; H01J 37/3405; H01J 37/3441; H01J 37/32633; H01J 2237/022; H01J 2237/0225; H01J 2237/026; H01J 2237/0268; H01J 37/32458; H01J 37/32477; H01J 37/32495; H01J 37/32504; H01J 37/32559; H01J 37/32862; H01J 37/32871; H01J 2237/028; H01J 37/32623–37/32651; H01J 37/32853; H01J 37/3414–37/3447; H01J 37/3488; H01L 51/56; H01L 21/2855; H01L 21/67005; H01L 21/67011; H01L 21/67069; H01L 21/67207; H01L 21/68735; F27B 17/0025; Y10S 156/916
USPC .................. 118/715–733; 156/345.1–345.55; 204/298.11; 257/E21.169
See application file for complete search history.

(56) References Cited

U.S. PATENT DOCUMENTS 5,240,580 A * 8/1993 Henderson et al. ...... 204/192.12
5,482,612 A * 1/1996 Armstrong et al. ...... 204/298.11
(Continued)

FOREIGN PATENT DOCUMENTS

GB      2350374 A * 11/2000 ............. C23C 14/56
GB      2419895 B * 6/2006
(Continued)

OTHER PUBLICATIONS

U. Wiklund et al., "Influence of Residual Stresses on Fracture and Delamination of Thin Hard," Wear 232 (1999) pp. 262-269.*
(Continued)

*Primary Examiner* — Parviz Hassanzadeh
*Assistant Examiner* — Stanislav Antolin
(74) *Attorney, Agent, or Firm* — Fitzpatrick, Cella, Harper & Scinto

(57) ABSTRACT

The inventors of this invention conducted a test and found out that to prevent peel-off of an adherent film, it is not of essential importance to set the radius of curvature equal to or larger than a predetermined threshold. The inventors of the present invention also found out that peel-off of an adherent film occurs in the region in which the curvature of a shield changes and is less likely to occur when the change in curvature of the shield is small. Accordingly, the key to the problem is the magnitude of a change in curvature of the shield, so changing the curvature stepwise makes it possible to suppress a large change in curvature, and thus to prevent peel-off of an adherent film free from any disadvantages such as deterioration in film thickness distribution, which may occur due to an increase in size of the shield.

7 Claims, 3 Drawing Sheets

(51) Int. Cl.
*C23C 14/56* (2006.01)
*C23C 16/44* (2006.01)
*C23C 16/455* (2006.01)
*C23C 16/458* (2006.01)
*H01J 37/32* (2006.01)
*H01J 37/34* (2006.01)

(52) U.S. Cl.
CPC ...... *C23C 16/4585* (2013.01); *H01J 37/32477* (2013.01); *H01J 37/32651* (2013.01); *H01J 37/3405* (2013.01); *H01J 37/3441* (2013.01); *C23C 14/0036* (2013.01); *C23C 16/45591* (2013.01); *H01J 37/3411* (2013.01); *H01J 2237/026* (2013.01); *H01J 2237/0268* (2013.01)

(56) References Cited

U.S. PATENT DOCUMENTS

| | | | | |
|---|---|---|---|---|
| 5,522,936 | A * | 6/1996 | Tamura | 118/723 R |
| 5,614,071 | A * | 3/1997 | Mahvan et al. | 204/298.11 |
| 6,113,705 | A | 9/2000 | Ohashi et al. | |
| 6,192,827 | B1 * | 2/2001 | Welch et al. | 118/723 E |
| 6,261,634 | B1 * | 7/2001 | Itoh | 118/723 E |
| 6,424,091 | B1 * | 7/2002 | Sawada et al. | 118/723 I |
| 6,533,868 | B1 | 3/2003 | Green et al. | |
| 6,645,357 | B2 * | 11/2003 | Powell | 204/298.11 |
| 7,001,491 | B2 | 2/2006 | Lombardi et al. | 204/192.12 |
| 7,041,200 | B2 | 5/2006 | Le et al. | 204/192.12 |
| 7,250,220 | B1 | 7/2007 | Rymer et al. | 428/469 |
| 7,807,553 | B2 | 10/2010 | Shibagaki et al. | 438/522 |
| 2002/0090464 | A1 | 7/2002 | Jiang et al. | 427/446 |
| 2003/0188685 | A1 * | 10/2003 | Wang et al. | 118/715 |
| 2004/0226518 | A1 * | 11/2004 | Takata et al. | 118/733 |
| 2005/0016462 | A1 * | 1/2005 | Yamazaki | 118/726 |
| 2005/0271984 | A1 * | 12/2005 | Brueckner et al. | 430/323 |
| 2006/0065196 | A1 * | 3/2006 | Yokogawa | 118/728 |
| 2006/0172517 | A1 * | 8/2006 | Brown et al. | 438/584 |
| 2007/0158305 | A1 * | 7/2007 | Cooke et al. | 216/67 |
| 2008/0078326 | A1 * | 4/2008 | Sung et al. | 118/723 R |
| 2008/0099326 | A1 * | 5/2008 | Ye et al. | 204/192.25 |
| 2008/0141942 | A1 * | 6/2008 | Brown et al. | 118/723 R |
| 2008/0257263 | A1 * | 10/2008 | Pavloff et al. | 118/723 R |
| 2008/0264340 | A1 * | 10/2008 | Martinson et al. | 118/715 |
| 2009/0191724 | A1 | 7/2009 | Shibagaki et al. | 438/796 |
| 2009/0206521 | A1 * | 8/2009 | Begovic | 118/715 |
| 2009/0283037 | A1 * | 11/2009 | Hardikar et al. | 118/504 |
| 2009/0311145 | A1 * | 12/2009 | Wu et al. | 422/129 |
| 2010/0006560 | A1 | 1/2010 | Egami et al. | 219/430 |

FOREIGN PATENT DOCUMENTS

| | | | |
|---|---|---|---|
| JP | 1-92335 A | 4/1989 | |
| JP | 5-121358 | 5/1993 | |
| JP | 6-145976 | 5/1994 | |
| JP | 8-293469 A | 11/1996 | |
| JP | 08293469 A * | 11/1996 | ............ H01L 21/203 |
| JP | 2000-355762 A | 12/2000 | |
| JP | 2001-073115 | 3/2001 | |
| JP | 2005-133183 A | 5/2005 | |
| JP | 2005133183 A * | 5/2005 | .............. C23C 14/00 |
| TW | 408372 B | 10/2000 | |
| TW | 200514139 A | 4/2005 | |
| TW | 200941576 A1 | 10/2009 | |
| WO | 2007/032166 A1 | 3/2007 | |
| WO | WO 2007032166 A1 * | 3/2007 | |

OTHER PUBLICATIONS

J. W. Hutchinson, "Delamination of Compressed Film on Curved Substrates," J. Mech. Phys. Solids 49 (2001) pp. 1847-1864.*

H-h. Yu et al., "Delamination of Thin Film Strips," Thin Solid Films 423 (2003) pp. 54-63.*

S. Faulhaber et al. "Buckling Delamination in Compressed Multilayers on Curved Substrates with Accompanying Ridge Cracks," J. Mech. Phys. Solids 54 (2006) pp. 1004-1028.*

Office Action issued in Taiwanese Application No. 099145222, dated Jul. 25, 2013 (5 pages).

Office Action issued in Japanese Application No. 2010-274888, dated Apr. 21, 2014 (6 pgs).

* cited by examiner

THIN FILM FORMING APPARATUS, THIN FILM FORMING METHOD, AND SHIELD COMPONENT

BACKGROUND OF THE INVENTION

1. Field of the Invention

The present invention relates to a thin film forming apparatus and thin film forming method used for a deposition process in manufacturing, for example, a semiconductor, a magnetic recording medium, a solar cell, or a liquid crystal display, and a shield component which can be used for the thin film forming apparatus.

2. Description of the Related Art

A thin film forming apparatus used in producing a product such as a semiconductor or a magnetic recording medium is intended to deposit a thin film, such as a metal film, on a substrate, such as a silicon wafer.

However, at the same time, this thin film is also deposited on various portions inside the apparatus, other than the target substrate. This deposited thin film will be called an adherent film hereinafter. The thickness of the adherent film increases as production is continued and deposition on a substrate is performed an increasing number of times. When the thickness of the adherent film exceeds a certain threshold, the adherent film peels off the surface, on which it has been deposited, due to a stress acting on itself. If the adherent film peels off during production, that is, during deposition on the substrate, the atmosphere in the apparatus changes. Because the thin film deposited on the substrate on this occasion contains particles originating from the adherent film, the reproducible film quality expected of the deposited film cannot be obtained. In, for example, a sputtering apparatus, when peel-off of an adherent film occurs during deposition, the plasma discharge conditions used in the sputtering process change, and the quality of the deposited film, in turn, changes.

Also, when peel-off of an adherent film occurs during the period in which the substrate is unloaded from the apparatus upon completion of deposition, if the next substrate is loaded into the apparatus, and deposition starts again, a particle often adheres onto the substrate surface or the substrate support table, thus making it impossible to obtain a given film quality. Depending on the deposition method, deposition itself may become impossible, posing a significant disadvantage. In, for example, a sputtering apparatus, the peeled, adherent film may change the electrical circuit characteristics of the apparatus. In such a case, unless the production in progress is stopped, the interior of the apparatus is cleaned and the peeled, adherent film is removed, plasma discharge cannot take place and production may become impossible.

To avoid these disadvantages, thin film forming apparatuses widely adopt a technique of having a built-in structure called a shield to protect the portions to which an adherent film must not adhere and periodically replacing the shield with a new one before the adherent film adhered to the shield becomes so thick as to peel off.

In putting a thin film forming apparatus into operation, an effort is made to minimize the number of times the shield needs to be replaced. That is, it is advantageous in putting the apparatus into operation to set a long shield maintenance cycle because this makes it possible to prolong the production time and save the cost required for shield replacement and cleaning in preparation for recycling.

Hence, it is common practice to process a shield to make it hard for an adherent film to peel off. For example, the shield surface is intentionally processed to have a three-dimensional pattern, for example by roughening it by blasting or spraying it with another material such as aluminum or titanium. With these types of processing, the adhesiveness of the adherent film adhering on the shield surface is improved to make it hard for the adherent film to peel off.

The same effect is known to be produced by shaping a shield such that its opening edge has a curvature equal to or larger than a predetermined threshold. For example, Mukai et al. point out in Japanese Patent Laid-Open No. 06-145976 (patent reference 1) that the amount of adhering particles per 5-inch wafer was reduced when the radius of curvature of the opening edge of a dark space shield used in the vicinity of a target for a magnetron sputtering apparatus used for an aluminum thin film was set to 3 mm or more. Similarly, Nishiwaki et al. point out in Japanese Patent Laid-Open No. 05-121358 (patent reference 2) advantages in setting the curvatures of the shield end face and corner to 1 mm to 10 mm in a sputtering apparatus used for a refractory metal film, and Ikeda et al. point out in Japanese Patent Laid-Open No. 2001-073115 (patent reference 3) advantages in setting the radii of curvature of the shield opening edge and bent portion to 0.3 mm or more in a carbon sputtering apparatus.

The shield shape includes a flat surface and a corner or curved surface. Hence, patent references 1, 2, and 3 disclose that a shield is desirably designed to have a corner or curved surface with a large radius of curvature in a region in which a change from the flat surface to the corner or curved surface takes place, or conversely, that from the corner or curved surface to the flat surface takes place.

However, a shield having a curved surface with a large radius of curvature inevitably has a large overall size. On the other hand, to place a shield in a deposition apparatus, the shield cannot be unlimitedly large and must have a size that falls within a predetermined limit. Also, as the overall shield size increases, the number of members used naturally increases, so the shield weight gets heavier. This causes difficulties in handling in terms of design associated with a method of disposing the shield, and raises the cost of the shield.

Moreover, desired deposition becomes impossible due to the occurrence of design and process constraints. When, for example, a deposition apparatus which performs deposition by sputtering that uses plasma discharge adopts a shield with a large radius of curvature, the plasma discharge space becomes narrower than when it adopts a shield with a small radius of curvature, and the characteristics and properties of the plasma itself change considerably, so a film quality reproducibility expected of the film deposited on the substrate cannot be obtained. More specifically, in that case, because the distance between the target and the shield shortens, the film thickness distribution within the plane of the film which is deposited on the substrate at a position farther than the shield when viewed from the target deteriorates.

SUMMARY OF THE INVENTION

The present invention has been made in consideration of the above-mentioned problems, and provides a thin film forming apparatus including a shield which can prevent an adherent film from peeling off and can be placed without incurring process constraints such as deterioration in processing characteristics, and therefore has excellent design performance.

According to one aspect of the present invention, there is provided a thin film forming apparatus comprising:

a shield which is provided inside a vacuum chamber having a deposition space used to perform deposition on a substrate, and is configured to prevent a film from adhering onto an inner wall of the vacuum chamber, wherein the shield has, as a surface thereof facing the deposition space, one of a curved surface, a radius of curvature of which changes continuously, and a curved surface, the radius of which changes stepwise.

According to another aspect of the present invention, there is provided a thin film forming apparatus comprising:

a vacuum chamber;

a substrate holder which can hold a substrate, on which a thin film is to be formed, inside the vacuum chamber;

an electrode to which a target can be attached while being opposed to the substrate holder inside the vacuum chamber;

a high-voltage application unit which is connected to the electrode and configured to bring about discharge for plasma generation in a deposition space between the substrate holder and the electrode; and a shield which is provided inside the vacuum chamber and configured to prevent a film from adhering onto an inner wall of the vacuum chamber, wherein the shield has, as a surface thereof facing the deposition space, one of a curved surface, a radius of curvature of which changes continuously, and a curved surface, the radius of curvature of which changes stepwise.

According to the present invention, a flat surface and curved surface which form a region in which an adherent film adheres onto a shield have a continuous curved surface which has only a small change in radius of curvature. This makes it possible to reduce a stress acting on the adherent film adhering on the boundary region between each flat surface and the curved surface. A shield having a surface on which peel-off of an adherent film is less likely to occur can be formed and has a small overall shield size, thus able to be easily placed in a deposition apparatus and handled without deteriorating the film thickness distribution.

Note that more excellent prevention of peel-off of an adherent film and apparatus downsizing can be achieved by designing a shield to have only a small change in curvature especially in the region in which the adherent film adheres onto the shield.

Further features of the present invention will become apparent from the following description of exemplary embodiments with reference to the attached drawings.

DESCRIPTION OF THE EMBODIMENTS

Figure 1:
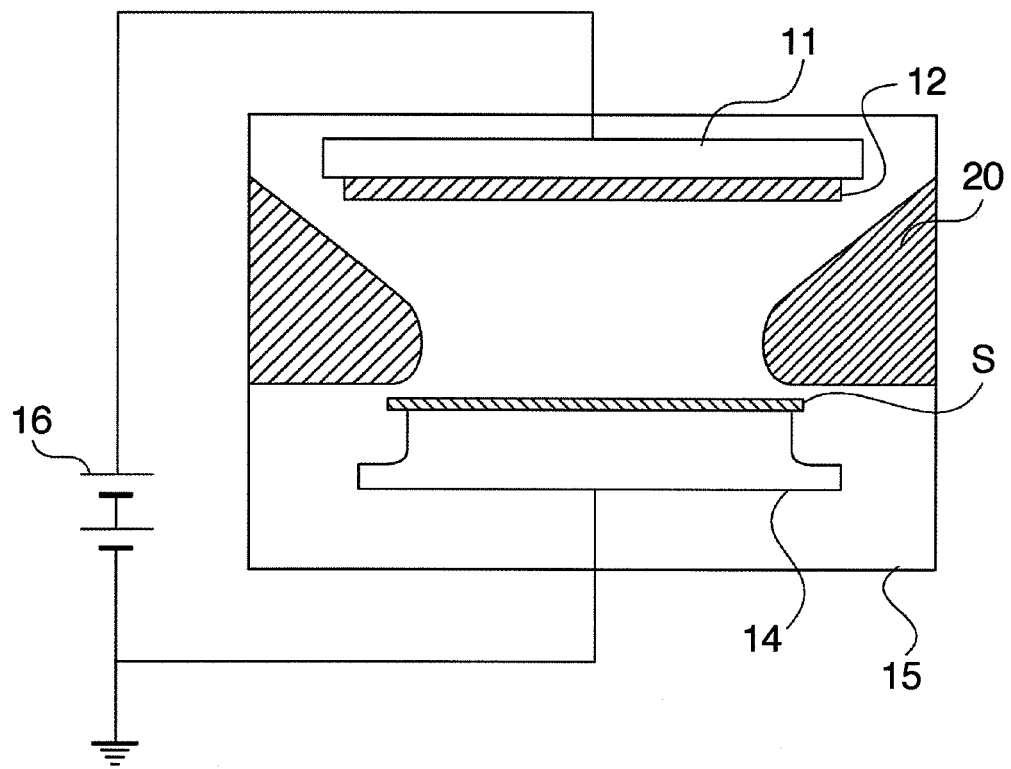
FIG. 1 is a view showing the schematic arrangement of a sputtering apparatus according to an embodiment of the present invention.

FIG. 1 shows the schematic arrangement of a sputtering apparatus according to an embodiment of the present invention. The sputtering apparatus shown in FIG. 1 includes a vacuum chamber 15, a substrate holder 14 which can hold a substrate S, on which a thin film is to be formed, inside the vacuum chamber 15, an electrode 11 to which a target 12 can be attached while being opposed to the substrate holder 14, and a side-wall shield 20 for preventing a film from adhering onto the inner wall of the vacuum chamber 15. The electrode 11 is connected to a high-voltage application unit 16 which can supply a high voltage used to bring about discharge for plasma generation across the substrate S and the target 12. The high-voltage application unit 16 may be a DC power source for DC discharge, a high-frequency power source for high-frequency discharge, or a combination thereof. Also, although not shown in FIG. 1, the vacuum chamber 15 is connected to a vacuum pump which can evacuate and decompress the vacuum chamber 15, and a gas introduction system which can introduce a discharge gas and a reactive gas for use in reactive sputtering.

Figure 2:
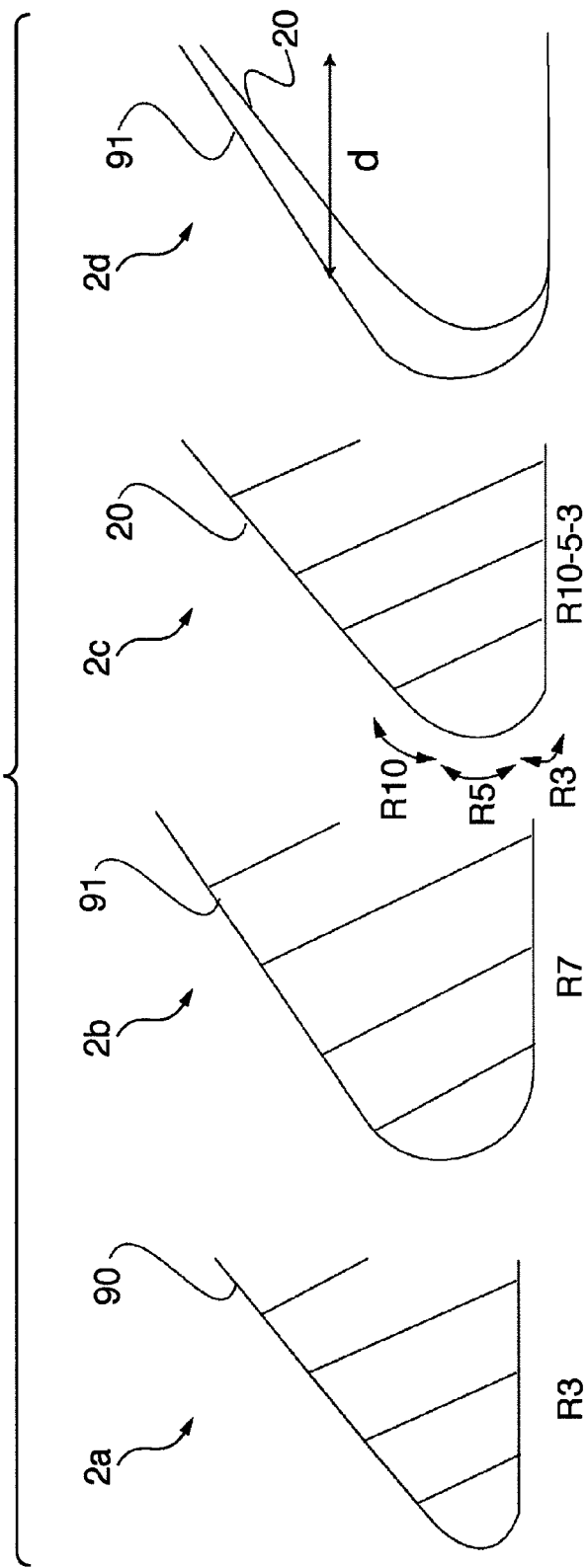
FIG. 2 shows partial schematic sectional views of side-wall shields (2a and 2b show Comparative Examples, 2c shows an Example, and 2d is a view for explaining the effect of the Example)

2c in FIG. 2 is a partial sectional view showing the side-wall shield 20 according to this embodiment. The side-wall shield 20 shown in 2c of FIG. 2 is formed such that it extends from the side of the target 12 toward the substrate S and the end of the side-wall shield 20 on the side of the substrate S projects from the side of the side wall of the vacuum chamber 15 toward the substrate S. The side-wall shield 20 has, as its surface facing the deposition space, a curved surface, the radius of curvature of which changes continuously, or that, the radius of curvature of which changes stepwise. The side-wall shield 20 has a curved surface in which the radius of curvature of its cross-section continuously decreases in the direction from the electrode 11 to the substrate holder 14, or that in which the radius of curvature of its cross-section decreases stepwise in this direction. The curvature change rate of the radius of curvature which changes stepwise is less than 0.33. Although the member of the side-wall shield 20 is not particularly limited in the present invention, it can be made of, for example, stainless steel, aluminum, titanium, iron, chromium, nickel, copper, or an alloy thereof, and can be shaped by, for example, molding, cutting, or laser processing using such a material. Although the side-wall shield 20 is a solid member in this case, it may be formed by bending a plate-like member. Although a surface treatment of the side-wall shield 20 is not particularly limited either, the effect of preventing peel-off of an adherent film can be enhanced by blasting the shield surface or spraying it with aluminum, alumina, titanium, nickel, copper, yttria, or a complex material thereof.

The continuous curved surface will be described in detail next. It has previously been pointed out that when the radius of curvature of the opening edge or end of the side-wall shield 20 is set to a predetermined threshold or more, this produces the effect of preventing peel-off of an adherent film. However, the inventors of the present invention tested this theory and found out that to prevent peel-off of an adherent film, it is not of essential importance to set the radius of curvature equal to or larger than a predetermined threshold. The inventors of the present invention also found out that peel-off of an adherent film occurs in the region in which the curvature of a shield changes and is less likely to occur when the change in curvature of the shield is small. Accordingly, the key to the problem is a change in curvature of the shield, so changing the curvature stepwise makes it possible to reduce the change in curvature, and thus to prevent peel-off of an adherent film, while remaining free from any disadvantages such as deterioration in film thickness distribution, which may occur due to an increase in the size of the shield. Details of this mechanism will be described hereinafter.

In the present invention, the shield desirably has a shape which allows its flat surface or curved surface to have only a small change in curvature in the boundary region, the radius of curvature of which changes. The magnitude of a change in curvature of the flat surface or curved surface of the shield is defined as a curvature change rate in the following way.

When the curve is an arc of a semicircle with a radius of curvature R (unit: mm), it can be described by:

$$y=(R^2-x^2)^{1/2} \quad (1)$$

($y \geq 0$, $-R < x < R$, and x and y are expressed in mm)

The rate of change in slope of a tangent to the arc is the second-order derivative of x as given by:

$$\partial^2 y/\partial x^2 = -(R^2-x^2)^{-1/2} - x^2(R^2-x^2)^{-3/2} \quad (2)$$

The rate of change in slope at the position x=0 and y=R is given by:

$$\partial^2 y/\partial x^2|_{x=0} = -1/R \quad (3)$$

This equation expresses the rate of change in slope of a tangent as a function of the radius of curvature R. This equation is determined as f(R). From the foregoing description, when the radius of curvature R (unit: mm) changes from R0 to R1, the magnitude of a fluctuation in curvature at its point of inflection is defined using f(R) presented in equation (3) as:

$$|f(R1)-f(R0)| \quad (4)$$

This equation is determined as the curvature change rate F(R1, R0). When a change from a straight line to a curve with the radius of curvature R1 takes place, the curvature change rate can be defined as the magnitude of a fluctuation in curvature at its point of inflection assuming that the radius of curvature R0 is infinitely large:

$$F(R1,\infty)=|f(R1)-f(\infty)|=|f(R1)| \quad (5)$$

The side-wall shield 20 used for a deposition apparatus has, as its surface which faces the deposition space and onto which an adherent film may adhere, a curved surface, the radius of curvature of which changes continuously, or that, the radius of curvature of which changes stepwise. The shield is desirably designed such that all the curvature change rates of the radii of curvature which change stepwise become less than 0.33. In an Example to be described later, film peel-off was actually observed in a portion with a curvature change rate of 0.333 (the number of significant digits after the decimal point is three) corresponding to a change from a flat surface to a curved surface with a radius of curvature of 3 mm. Therefore, by designing a shield to have a curvature change rate less than 0.33, peel-off of an adherent film can be remarkably prevented, while suppressing an increase in size of the shield, compared with a curvature change rate of 0.33 or more.

In this embodiment, a shield having a curved surface, the radius of curvature of which changes stepwise, is evaluated. However, even when a shield having a curved surface, the radius of curvature of which gradually and continuously changes such as an ellipse, is employed instead, the same effect can be obtained.

Also, the present invention is not limited to the side-wall shield 20, and is applicable to all structural members having surfaces facing the plasma space, such as a holder shield for preventing a film from adhering onto the substrate holder 14, and shields for preventing a film from adhering onto the ceiling and floor. Although FIG. 1 shows a sputtering apparatus in which a substrate and a target face each other while standing still, the present invention is also applicable to, for example, an offset sputtering apparatus in which a target is disposed with its center being shifted from that of the substrate. Although the use of a sputtering apparatus to which the present invention is applicable is not particularly limited, the present invention is preferably applicable especially to a thin film forming apparatus which forms a film made of a material, that has a property of generating a strong shearing stress upon being deposited at a thickness equal to or larger than a predetermined threshold, such as tungsten, tungsten nitride, titanium, or titanium nitride, such as a sputtering apparatus.

Moreover, the present invention is not limited to a sputtering apparatus, and is applicable to, for example, a CVD (Chemical Vapor Deposition) apparatus.

A thin film forming method according to the embodiment of the present invention includes the step of forming a thin film on a substrate using a thin film forming apparatus such as a sputtering apparatus. A shield component according to the embodiment of the present invention is used for the thin film forming apparatus. The thin film forming apparatus includes a vacuum chamber, a substrate holder which can hold a substrate on which a thin film is to be formed inside the vacuum chamber, and an electrode to which an electrode target to which a target can be attached while being opposed to the substrate holder inside the vacuum chamber can be attached. The shield component can be disposed inside the vacuum chamber on the lateral side of the deposition space between the substrate holder and the electrode. Also, the shield component has, as its surface facing the deposition space, a curved surface in which the radius of curvature of its cross-section continuously decreases in the direction from the electrode to the substrate holder, or that in which the radius of curvature of its cross-section decreases stepwise in this direction.

Example 1

Example 1 will be described below. 2c in FIG. 2 shows an example of a side-wall shield 20 according to Example 1. In the surface of the side-wall shield 20, which is opposed to the deposition space (its surface facing the deposition space), that is, in its region in which an adherent film may be deposited on the side-wall shield 20, the radius of curvature changes from the value of a flat surface (infinitely large value) to that of a curved surface with a radius of curvature of R10 mm, and further changes stepwise to that of a curved surface with a radius of curvature of R5 mm and then that of a curved surface with a radius of curvature of R3 mm. In the region on the side-wall shield 20, which cannot be directly viewed from the side of a target 12 in a vacuum chamber 15, the radius of curvature changes stepwise from the value of a curved surface with a radius of curvature of R3 mm, to that of a flat surface (infinitely large value). The radius of curvature stays constant within the plane of each of the curved surfaces with radii of curvature of R10 mm, R5 mm, and R3 mm. 2b in FIG. 2 shows a side-wall shield 91 with a radius of curvature of 7 mm according to a Comparative example. 2b in FIG. 2 is the same as 2c in FIG. 2 except that in the former in the surface of the side-wall shield 91, which is opposed to the target (its surface facing the deposition space), that is, in its region in which an adherent film is easily deposited on the side-wall shield 91, the radius of curvature changes from the value of a flat surface (infinitely large value) to that of a curved surface with a radius of curvature of 7 mm, and in its region which cannot be directly viewed from the side of the target, the radius of curvature changes from the value of a curved surface with a radius of curvature of 7 mm to that of a flat surface.

In the Comparative Example, the amount of projection d toward the deposition space is relatively large, as shown in 2d of FIG. 2, so the side-wall shield 91 can be easily sputtered by a discharge gas. When the particles sputtered from the side-wall shield 91 scatter onto the substrate, the film thickness distribution may deteriorate. For example, it has been found that the use of a shield with a large radius of curvature slightly deteriorates the uniformity within the plane of the substrate. Assume, for example, that a stacked film made of tungsten or tungsten nitride is deposited on a silicon substrate with a diameter of 300 mm by about 60 nm. In this case, when a shield with a radius of curvature of R3 mm was used, the thickness distribution (R/2X) of the deposited film within the plane of the substrate was 2.28%. In contrast, when a shield with a radius of curvature of 7 mm was used, this thickness distribution deteriorated to 2.48%.

To perform deposition without changing the degree of opening for the substrate, that is, without considerably changing the film quality of the substrate by the deposition apparatus, it is necessary to design a shield with a volume larger than the side-wall shield 91 shown in 2b of FIG. 2, and also to separately examine whether this shield can be actually placed inside the deposition apparatus.

In contrast, according to the present invention, a shield can be designed such that an adherent film is less likely to peel off than the conventional design and the film quality such as the film thickness distribution does not deteriorate, without increasing its size.

Example 2

Figure 3:
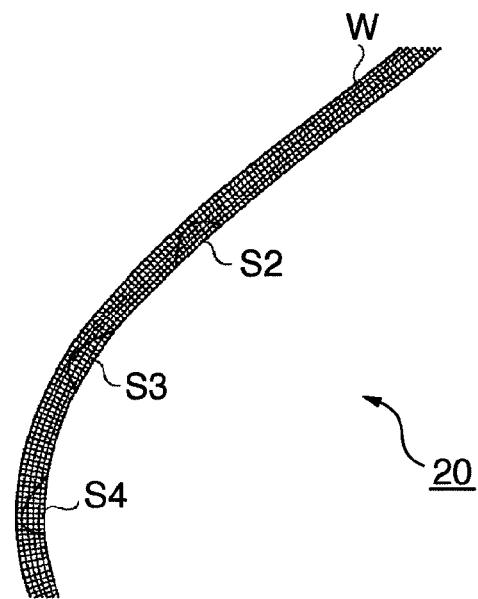
FIG. 3 is a view for explaining a stress acting on a film deposited on the side-wall shield according to the Example.
Figure 4:
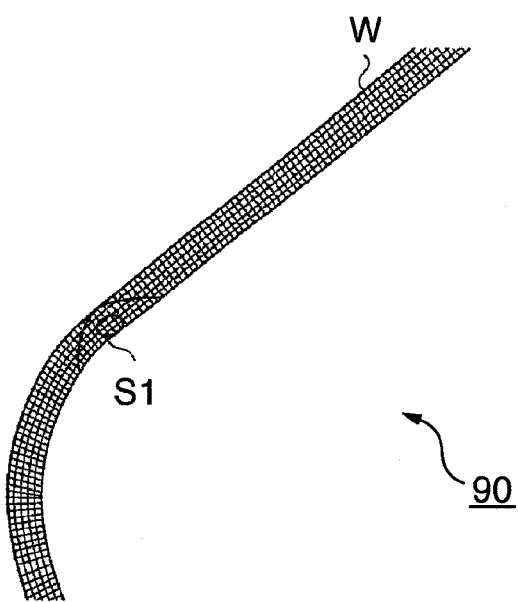
FIG. 4 is a view for explaining a stress acting on a film deposited on the side-wall shield according to the Comparative Example.

FIGS. 3 and 4 each show the result of calculating a stress acting on an adherent film W adhering on the boundary region between the flat surface and curved surface of a side-wall shield made of SUS304 after tungsten adheres onto the side-wall shield at a thickness of 0.5 mm. FIG. 3 shows the calculation result for the side-wall shield 20 with a continuous curved surface, shown in 2c of FIG. 2. FIG. 4 shows the calculation result for a side-wall shield 90 with a radius of curvature of R3 mm, shown in 2a of FIG. 2. In the side-wall shield 90 shown in 2a of FIG. 2, in its surface opposed to a target 12 (its surface facing the deposition space), that is, in its region in which an adherent film is easily deposited, the radius of curvature changes from the value of a flat surface (infinitely large value) to that of a curved surface with a radius of curvature of R3 mm, and in its region which cannot be directly viewed from the side of the target 12, the radius of curvature changes from the value of a curved surface with a radius of curvature of R3 mm to that of a flat surface (infinitely large value). The side-wall shield 90 with a radius of curvature of R3 mm shown in FIG. 4 has only one point which falls within the region in which an adherent film may adhere onto it, and at which a stress may act on the adherent film (a point S1 at which the shield changes from a flat surface to a curved surface in FIG. 4 and which has a curvature change rate of 0.333), and the stress has a magnitude of about 60 MPa. On the other hand, the side-wall shield 20 shown in FIG. 3 has a larger number of points, that is, three points at each of which a stress may act on the adherent film (in FIG. 3, a point S2 at which the shield changes from a flat surface to a curved surface with a radius of curvature R10 and which has a curvature change rate of 0.1, a point S3 at which the shield changes from a curved surface with a radius of curvature R10 to that with a radius of curvature R5 and which has a curvature change rate of 0.1, and a point S4 at which the shield changes from a curved surface with a radius of curvature R5 to that with a radius of curvature R3 and which has a curvature change rate of 0.133). The stresses acting at the points S2, S3, and S4, respectively, have magnitudes of 20 MPa or less.

Example 3

The experimental result that verified the above-mentioned calculation result will be described. In this test, argon gas was introduced into a chamber evacuated to a vacuum, and was exhausted while the pressure in the apparatus was held at a pressure of 0.5 Pa or its neighborhood. In this state, a constant DC power was supplied to the apparatus to sputter the surface of a target made of tungsten, thereby depositing a tungsten thin film on a silicon substrate.

Deposition was performed using the side-wall shield 20 according to the present invention, shown in 2c of FIG. 2. Even when the product of the power and the time integration value exceeded 220 kWH, film peel-off was not observed, and no abnormality such as an excessive amount of particles was observed on the thin film deposited on the substrate. Therefore, deposition which reproduces a given film quality could be performed.

In contrast, when the side-wall shield 90 with a radius of curvature of 3 mm, shown in 2a of FIG. 2, was used, and the product of the power and the time integration value was 180 kWH to 220 kWH, peel-off of an adherent film which had adhered in the vicinity of the boundary between the flat surface and the curved surface occurred on the surface of the shield, which is opposed to the target (its surface facing the deposition space). That is, peel-off of an adherent film occurred in the region in which the flat surface and the curved surface are in contact with each other on the shield surface. It was verified that peel-off of an adherent film is less likely to occur when the change in radius of curvature in the region in which the flat surface and the curved surface are in contact with each other is relatively small than when this change is relatively large.

As can be seen from the foregoing fact, the curvature change rate preferably has a value less than 0.333. Note that the same test was conducted on a side-wall shield with a curvature change rate of 0.143 (a side-wall shield having a curved surface which has a radius of curvature of 7 mm and is continuous with the flat surface), and according to the test result, film peel-off did not occur even when the product of the power and the time integration value exceeded 220 kWH.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-296786 filed Dec. 28, 2009 and Japanese Patent Application No. 2010-274888 filed Dec. 9, 2010, which are hereby incorporated by reference herein in their entirety.

What is claimed is:

1. A thin film forming apparatus comprising:
   a vacuum chamber;
   a substrate holder which can hold a substrate inside said vacuum chamber;
   an electrode to which a target can be attached while being opposed to said substrate holder inside said vacuum chamber; and
   a side-wall shield which faces a deposition space between the substrate and the target, and covers a side wall of said vacuum chamber for preventing a film from adhering onto the side wall of said vacuum chamber,
   wherein said side-wall shield extends from a position opposite to an end portion of the target toward a position opposite to an end portion of the substrate,
   wherein said side-wall shield formed at a side of the target has a first flat surface formed from the position opposite to the end portion of the target toward the deposition space, wherein said side-wall shield formed at a side of the substrate has a projection surface projecting from a side of the side wall of said vacuum chamber toward the deposition space, and a second flat surface formed from the end portion of the substrate toward the position opposite to the end portion of the substrate, wherein the projection surface is continuous with the first flat surface in a direction from said electrode toward said substrate holder, and the projection surface has a first curved surface having a radius of curvature of a cross-section of the projection surface which decreases continuously from an infinitely large value of the first flat surface in the direction up to a predetermined radius of curvature or a first curved surface having a radius of curvature of a cross-section of the projection surface which decreases stepwise from an infinitely large value of the first flat surface in the direction up to a predetermined radius of curvature, wherein the projection surface has a second curved surface having a radius of curvature of a cross-section of the projection surface which increases continuously from the predetermined radius of curvature up to an infinitely large value of the second flat surface or a second curved surface having a radius of curvature of a cross-section of the projection surface which increases stepwise from the predetermined radius of curvature up to an infinitely large value of the second flat surface, and wherein the second curved surface is continuous with the first curved surface in a direction from the deposition space toward the end portion of the substrate, and the second curved surface is continuous with the second flat surface.

2. The apparatus according to claim 1, wherein a curvature change rate of the radius of curvature which decreases stepwise is less than 0.33.

3. The apparatus according to claim 1, wherein said side-wall shield is made of a material selected from the group consisting of stainless steel, aluminum, titanium, iron, chromium, nickel, copper, and an alloy thereof, and a surface of said side-wall shield has undergone one of blasting and spraying with a material selected from the group consisting of aluminum, alumina, titanium, nickel, copper, yttria, and a complex material thereof.

4. The apparatus according to claim 1, wherein said side-wall shield is used to deposit a film containing tungsten or titanium.

5. The apparatus according to claim 1, wherein a subsequent stepwise decreased radius of curvature formed at a vicinity of said substrate holder is smaller than a first radius of curvature which decreases stepwise from the infinitely large value.

6. The apparatus according to claim 1,
wherein the first curved surface of the projection surface includes, in the direction:
a primary curved surface having a radius of curvature of the cross-section of the projection surface which decreases continuously from the infinitely large value of the first flat surface up to a first radius of curvature of the cross-section of the projection surface;
a secondary curved surface having a radius of curvature of the cross-section of the projection surface which decreases continuously from the first radius of curvature up to a second radius of curvature of the cross-section of the projection surface; and
a tertiary curved surface having a radius of curvature of the cross-section of the projection surface which decreases continuously from the second radius of curvature up to a third radius of curvature of the cross-section of the projection surface, and
wherein the second radius of curvature is smaller than the first radius of curvature and the third radius of curvature is smaller than the second radius of curvature.

7. The apparatus according to claim 1,
wherein the first curved surface of the projection surface includes, in the direction:
a primary curved surface having a radius of curvature of the cross-section of the projection surface which decreases stepwise from the infinitely large value of the first flat surface up to a first radius of curvature of the cross-section of the projection surface;
a secondary curved surface having a radius of curvature of the cross-section of the projection surface which decreases stepwise from the first radius of curvature of the projection surface up to a second radius of curvature of the cross-section of the projection surface; and
a tertiary curved surface having a radius of curvature of the cross-section of the projection surface which decreases stepwise from the second radius of curvature of the projection surface up to a third radius of curvature of the cross-section of the projection surface, and
wherein the second radius of curvature is smaller than the first radius of curvature and the third radius of curvature is smaller than the second radius of curvature.

* * * * *